United States Patent
Guilliams

(10) Patent No.: US 6,998,859 B1
(45) Date of Patent: Feb. 14, 2006

(54) TEST PROBE WITH SIDE ARM

(75) Inventor: Steven Nowlen Guilliams, San Francisco, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/926,536

(22) Filed: Aug. 25, 2004

(51) Int. Cl.
*G01R 31/02* (2006.01)

(52) U.S. Cl. .................................. 324/754; 324/761

(58) Field of Classification Search ............. 324/72.5, 324/754, 761–762, 756–757; 439/482, 912
See application file for complete search history.

(56) References Cited

U.S. PATENT DOCUMENTS

| | | | |
|---|---|---|---|
| 3,996,511 A | | 12/1976 | Baer |
| 4,417,206 A | * | 11/1983 | Stowers ................. 324/756 |
| 4,468,615 A | * | 8/1984 | Jamet et al. ............ 324/754 |
| 4,571,540 A | * | 2/1986 | Stowers et al. ......... 324/761 |
| 4,980,638 A | * | 12/1990 | Dermon et al. ......... 324/758 |
| 5,009,613 A | * | 4/1991 | Langgard et al. ....... 439/482 |
| 5,387,872 A | | 2/1995 | Nightingale |
| 5,457,392 A | | 10/1995 | Filipescu |
| 5,906,628 A | | 5/1999 | Miyawaki et al. |
| 6,504,223 B1 | | 1/2003 | Zhou et al. |
| 6,831,452 B1 | * | 12/2004 | McTigue ............... 324/72.5 |
| 2002/0002369 A1 | | 1/2002 | Hood |
| 2002/0052155 A1 | | 5/2002 | Campbell et al. |
| 2002/0105347 A1 | | 8/2002 | Maruyama et al. |
| 2002/0113612 A1 | | 8/2002 | Nguyen |
| 2003/0173944 A1 | | 9/2003 | Cannon |
| 2003/0224663 A1 | | 12/2003 | Johnson et al. |
| 2004/0024399 A1 | | 2/2004 | Sharps et al. |

FOREIGN PATENT DOCUMENTS

| | | |
|---|---|---|
| JP | 02-150773 | 6/1990 |
| JP | 06-118099 | 4/1994 |

OTHER PUBLICATIONS

Pomona Electronics Data Sheet, Model 6475, Test Probe Tips for 060 Series Probes (no month/year).
Pomona Electronics Data Sheet, Model 5674b, Deluxe Electronic DMM Test Lead Kit (no month/year).

* cited by examiner

*Primary Examiner*—Minh N. Tang
(74) *Attorney, Agent, or Firm*—Lorimer Laboratories; D'Arcy H. Lorimer

(57) ABSTRACT

The present invention discloses an electrical test probe having a side arm member attached to a main probe element at an angle less than 90 degrees. The length of the side arm is such that the end of the side arm does not make contact with surfaces being probed by the main probe tip. The side arm aids in the measurement of circuit component leads, pins and wires without causing short circuits when measuring closely spaced circuit board traces.

30 Claims, 4 Drawing Sheets

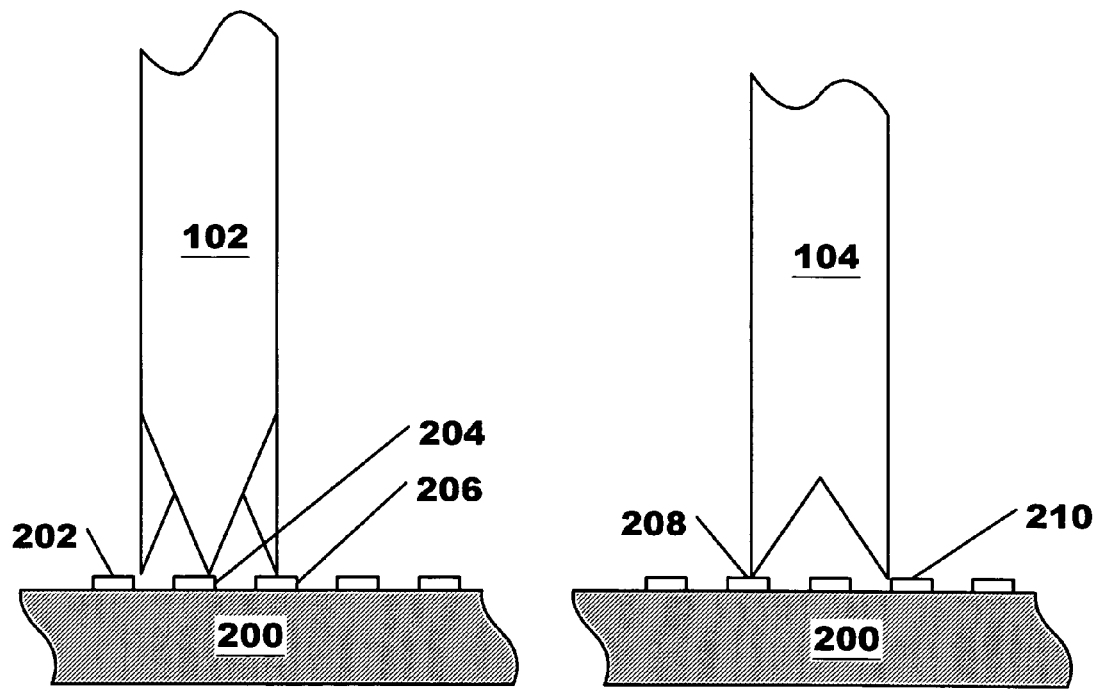
Figure 2a
(Prior Art)
Figure 2b
(Prior Art)
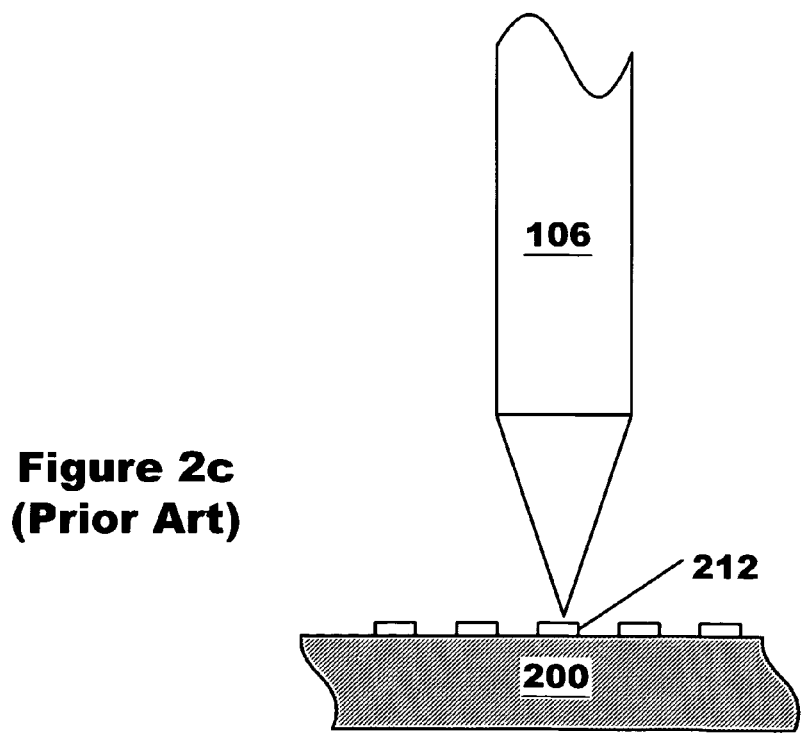
Figure 2c
(Prior Art)

TEST PROBE WITH SIDE ARM

BACKGROUND OF THE INVENTION

1. Field of the Invention

The present invention relates to the testing and monitoring of electronic circuits. More specifically, the present invention relates to test probes used to make measurements in electronic circuits.

2. Description of the Related Art

For the measurement of electronic parameters such as voltage, current, and resistance, many types of test probes have been developed. FIGS. 1a–e (Prior Art) are partial side views of various probe configurations in common use. FIG. 1c (Prior Art) illustrates one of the most common probe configurations, the simple needle type probe 106. While good for making contact with relatively flat surfaces, making measurements on small diameter pins, leads or wires 100 require a tangential contact with the pin's surface. The test probe is then subject to slippage while trying to make the measurement, potentially causing a short circuit with other pins or metal surfaces in the vicinity of the pin 100 being measured; loss of contact with desired test point is also possible. Probes more suitable for making measurements on pins are shown in FIGS. 1a and 1b (Prior Art). FIG. 1b illustrates a simple forked tip 104 which straddles the pin 100 being measured. This solution prevents slippage while measuring the pin, as long as the pin is less that the width of the probe tip. Larger pins cannot be easily accommodated, requiring multiple tips of varying sizes. The probe 102 shown in FIG. 1a is similar to that of FIG. 1b, but generally handles smaller pin diameters. Another common configuration 108 is that shown in FIGS. 1d and 1e (Prior Art). This type of probe employs a spring loaded hook 110 that must be opened (FIG. 1d) to capture pin 100. However, this type of probe is difficult to use when the measurement must be made on closely spaced pins or integrated circuit leads, since the spring loaded hook is often significantly larger than the pin diameter. This configuration is also not suitable for making measurements on flat printed circuit board traces. The springs and sliding parts are a source of reliability problems and complexity. FIGS. 2a–2c (Prior Art) are partial side views of current art test probes probing printed circuit boards with closely spaced traces. Of the three configurations 102, 104, and 106, the simple needle probe 106 is best suited to measure circuit board trace 212 on circuit board 200. Forked tip probe 104 can easily short traces 208 and 210, unless the probe tip is made considerably smaller in diameter, which reduces its practicality for measuring a wide variety of pins. The same is true for probe tip 102, which can potentially short traces 202, 204, and 206 in FIG. 2a. So, while the simple needle probe 106 is good for circuit board traces, it is difficult to use on pins leads and wires. The forked tip configurations 102 and 104 are acceptable for pins, leads and wires with diameters less than the probe tip dimension, but they are not easily applied to measure closely spaced circuit board traces.

What is needed is a simple, flexible probe that can measure both pins and circuit board traces without causing shorts, can measure a wide variety of pin sizes with a single probe, and has no moving parts.

SUMMARY OF THE INVENTION

It is an object of the present invention to provide an electrical probe device comprising a main member having a probe tip, and a side arm member having proximal and distal ends. The proximal end of the side arm member is attached to the outer surface of the main member at an angle less than 90 degrees. The distal end of the side arm is disposed in a direction toward the probe tip, wherein the distance from the proximal end of the side arm to the probe tip is greater than the distance from the proximal end to the distal end of the side arm.

It is another object of the present invention to provide an electrical probe device comprising a main member having a probe tip, and a side arm member having proximal and distal ends. The proximal end of the side arm member is attached to the outer surface of the main member at an angle less than 90 degrees. The distal end of the side arm is disposed in a direction toward the probe tip, wherein the distal end of the side arm does not contact a flat surface in contact with and normal to the probe tip.

Its is another object of the present invention to provide a method for measuring electrical parameters by contact with a circuit pin, including providing an electrical probe device comprising a main member having a probe tip, and a side arm member having proximal and distal ends. The proximal end of the side arm member is attached to the outer surface of the main member at an angle less than 90 degrees. The distal end of the side arm is disposed in a direction toward the probe tip, wherein the distance from the proximal end of the side arm to the probe tip is greater than the distance from the proximal end to the distal end of the side arm. The method further comprises placing the circuit pin between the side arm member and the main member, and contacting the circuit pin with the measurement probe.

It is yet another object of the present invention to provide a method for measuring electrical parameters by contact with a circuit board trace, including providing an electrical probe device comprising a main member having a probe tip, and a side arm member having proximal and distal ends. The proximal end of the side arm member is attached to the outer surface of the main member at an angle less than 90 degrees. The distal end of the side arm is disposed in a direction toward the probe tip, wherein the distal end of the side arm does not contact a flat surface in contact with and normal to the probe tip. The method further includes placing the probe tip in contact with the circuit board trace.

BRIEF DESCRIPTION OF THE DRAWINGS

The present invention will be better understood when consideration is given to the following detailed description thereof. Such description makes reference to the annexed drawings, wherein:

FIGS. 2a–2c (Prior Art) are partial side views of current art test probes probing printed circuit boards with closely spaced traces;

DETAILED DESCRIPTION OF THE PREFERRED EMBODIMENTS

FIGS. 1a–e (Prior Art) and FIGS. 2a–c (Prior Art) have been discussed in the Background section above.

Figure 1A:
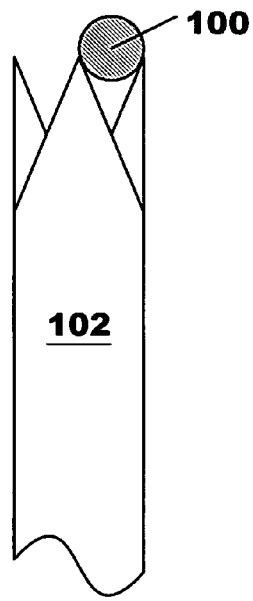
FIGS. 1a–e (Prior Art) are partial side views of various probe configurations in common use.
Figure 1B:
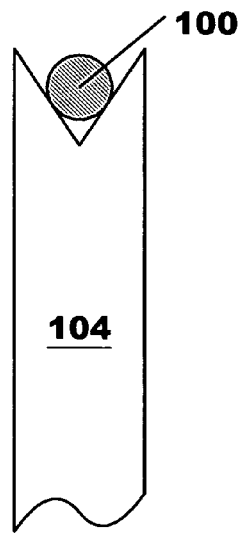
Figure 1C:
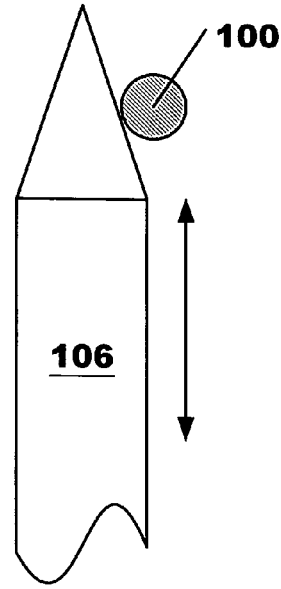
Figure 1D:
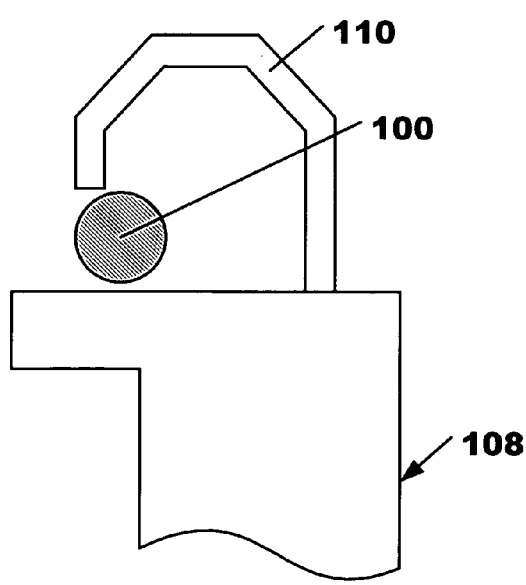
Figure 1E:
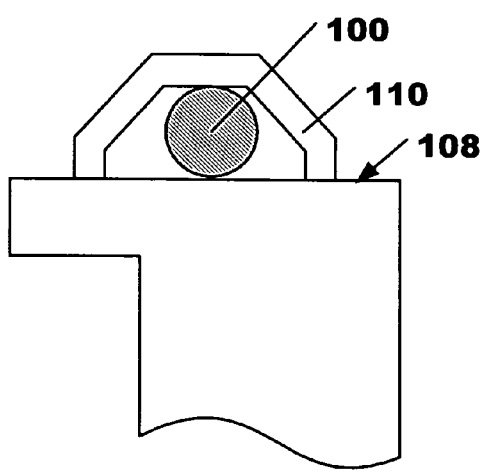
Figure 3:
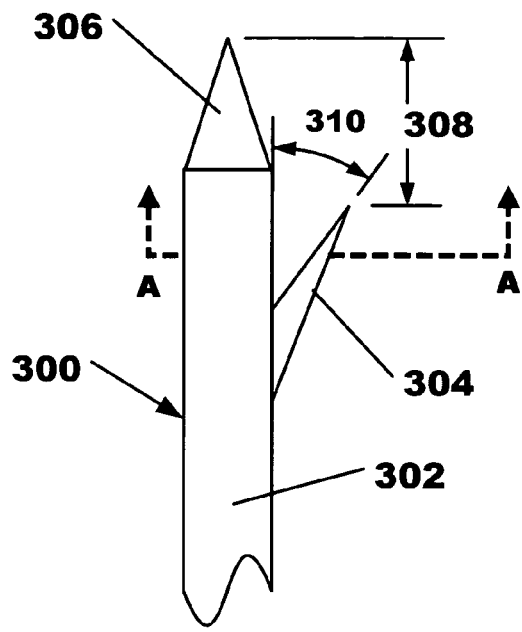
FIG. 3 is a partial side view of a test probe having a side arm according to an embodiment of the present invention.

FIG. 3 is a partial side view of a test probe 300 having a side arm 304 according to an embodiment of the present invention. Test probe 300 employs the advantages of the simple needle configuration for measuring circuit board traces with a side arm 304 to aid in measuring pins, wires, and integrated circuit leads. Probe 300 comprises a main member 302 that is terminated in sharpened tip 306. On one side of member 302, side arm member 304 is attached. Side arm member 304 is disposed at an angle 310 from the longitudinal axis of member 302. Angle 310 is greater than zero but less than 90 degrees, preferably between 20 and 60 degrees. Side arm member 304 can be any convenient length, but its attachment location on member 302 combined with angle 310 should result with the tip of member 304 residing a distance 308 from end of tip 306. Distance 308 must be greater than zero, preferably distance 308 should be greater than the diameter of member 302.

Figure 4A:
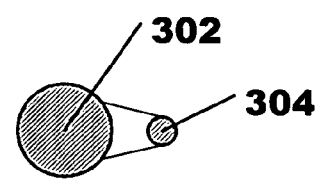
FIGS. 4a–4c are cross sectional views through section A—A of FIG. 3 according to embodiments of the present invention.
Figure 4B:
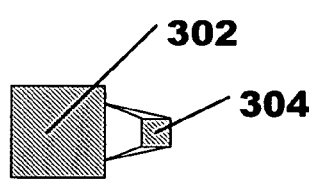
Figure 4C:
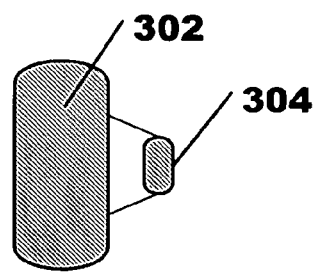

FIGS. 4a–4c are cross sectional views through section A—A of FIG. 3 according to embodiments of the present invention. Probe 300 may have round, square, or rectangular cross sections as illustrated in FIGS. 4a, 4b, and 4c. Alternatively, side arm 304 can have a different cross sectional shape than that of member 302 without impacting the functionality or usefulness of the invention.

Figure 5:
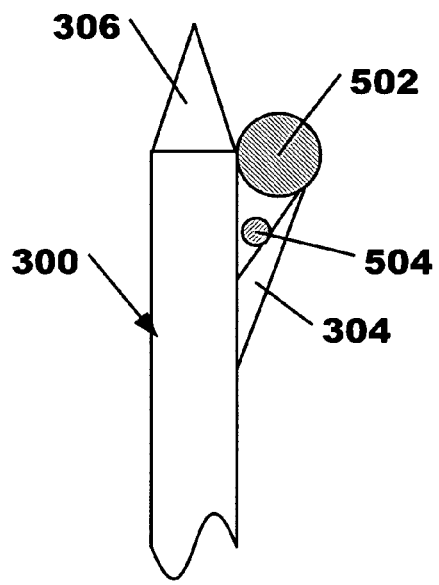
FIG. 5 is a partial side view of a test probe 300 measuring pins according to an embodiment of the present invention.

FIG. 5 is a partial side view of a test probe 300 measuring pins according to an embodiment of the present invention. Pins 502, 504 of widely varying diameters can be measured with probe 300 by lodging at least a portion of the pin's surface between the side arm 304 and member 302. The side arm prevents the probe from slipping along the side of the probe, and gives positive feedback that secure contact with the pin has been made. Even larger pins that those shown in the figure can also be measured, by opening angle 310. This feature allows the relative dimensions of the probe to be reduced to accommodate closely spaced pins.

Figure 6:
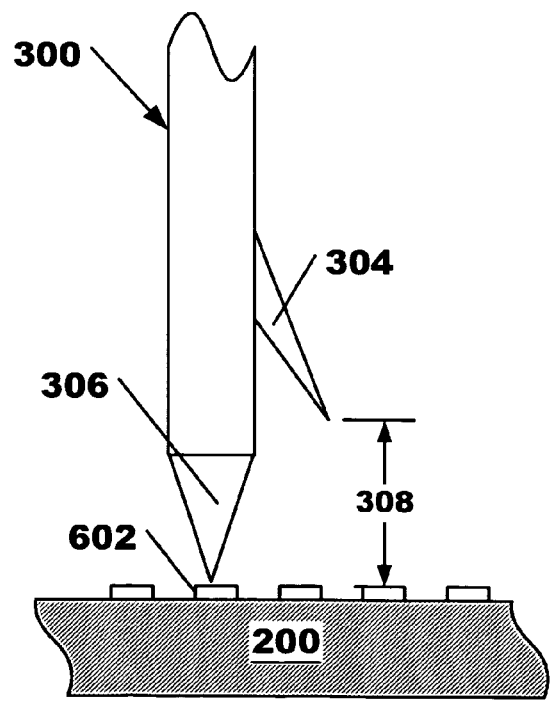
FIG. 6 is a partial side view of a test probe 300 measuring closely spaced traces on a printed circuit board according to an embodiment of the present invention.

FIG. 6 is a partial side view of a test probe 300 measuring closely spaced traces on a printed circuit board according to an embodiment of the present invention. By recessing the end of side arm 304 by distance 308, closely spaced traces 602 on circuit board 200 can be measured without concern of shorting adjacent traces. Thus, probe 300 of the present invention is useful for measuring pins, leads, wires, and circuit board traces and has no moving parts.

The present invention is not limited by the previous embodiments heretofore described. Rather, the scope of the present invention is to be defined by these descriptions taken together with the attached claims and their equivalents.

What is claimed is:

1. An electrical probe device comprising:
a main member having a probe tip; and,
a side arm member having proximal and distal ends,
said proximal end of said side arm member attached to an outer surface of said main member at an angle less than 90 degrees to said outer surface,
said distal end of said side arm disposed in a direction toward said probe tip,
wherein a distance from said proximal end of said side arm to said probe tip is greater than a distance from said proximal end to said distal end of said side arm.

2. An electrical probe device as recited in claim 1, wherein said side arm member is attached to said outer surface at an angle between 20 and 60 degrees.

3. An electrical probe device as recited in claim 1, wherein a distance from said distal end of said side arm to a flat surface in contact with and normal to said probe tip is greater than a diameter of said main member.

4. An electrical probe device as recited in claim 1, wherein said distal end of said side arm does not contact a flat surface in contact with and normal to said probe tip.

5. An electrical probe device as recited in claim 1, wherein cross sections of said main member and said side arm are substantially circular.

6. An electrical probe device as recited in claim 1, wherein cross sections of said main member and said side arm are substantially square.

7. An electrical probe device as recited in claim 1, wherein cross sections of said main member and said side arm are substantially rectangular.

8. An electrical probe device as recited in claim 1, wherein cross sections of said main member and said side arm are substantially elliptical.

9. An electrical probe device comprising:
a main member having a probe tip; and,
a side arm member having proximal and distal ends,
said proximal end of said side arm member attached to an outer surface of said main member at an angle less than 90 degrees to said outer surface,
said distal end of said side arm disposed in a direction toward said probe tip,
wherein said distal end of said side arm does not contact a flat surface in contact with and normal to said probe tip.

10. An electrical probe device as recited in claim 9, wherein said side arm member is attached to said outer surface at an angle between 20 and 60 degrees.

11. An electrical probe device as recited in claim 9, wherein a distance from said distal end of said side arm to a flat surface in contact with and normal to said probe tip is greater than a diameter of said main member.

12. An electrical probe device as recited in claim 9, wherein cross sections of said main member and said side arm are substantially circular.

13. An electrical probe device as recited in claim 9, wherein cross sections of said main member and said side arm are substantially square.

14. An electrical probe device as recited in claim 9, wherein cross sections of said main member and said side arm are substantially rectangular.

15. An electrical probe device as recited in claim 9, wherein cross sections of said main member and said side arm are substantially elliptical.

16. A method for measuring electrical parameters by contact with a circuit pin, comprising:
providing a measurement probe including
a main member having a probe tip, and
a side arm member having proximal and distal ends,
said proximal end of said side arm member attached to an outer surface of said main member at an angle less than 90 degrees to said outer surface,
said distal end of said side arm disposed in a direction toward said probe tip,
wherein a distance from said proximal end of said side arm to said probe tip is greater than a distance from said proximal end to said distal end of said side arm;
placing said circuit pin between said side arm member and said main member; and contacting said circuit pin with said measurement probe.

17. The method as recited in claim 16, wherein said side arm member is attached to said outer surface at an angle between 20 and 60 degrees.

18. The method as recited in claim 16, wherein a distance from said distal end of said side arm to a flat surface in contact with and normal to said probe tip is greater than a diameter of said main member.

19. The method as recited in claim 16, wherein said distal end of said side arm does not contact a flat surface in contact with and normal to said probe tip.

20. The method as recited in claim 16, wherein cross sections of said main member and said side arm are substantially circular.

21. The method as recited in claim 16, wherein cross sections of said main member and said side arm are substantially square.

22. The method as recited in claim 16, wherein cross sections of said main member and said side arm are substantially rectangular.

23. The method as recited in claim 16, wherein cross sections of said main member and said side arm are substantially elliptical.

24. A method for measuring electrical parameters by contact with a circuit board trace, comprising:
   providing a measurement probe including
      a main member having a probe tip; and,
      a side arm member having proximal and distal ends,
      said proximal end of said side arm member attached to an outer surface of said main member at an angle less than 90 degrees to said outer surface, said distal end of said side arm disposed in a direction toward said probe tip, wherein said distal end of said side arm does not contact a flat surface in contact with and normal to said probe tip; and,
   placing said probe tip in contact with said circuit board trace.

25. The method as recited in claim 24, wherein said side arm member is attached to said outer surface at an angle between 20 and 60 degrees.

26. The method as recited in claim 24, wherein a distance from said distal end of said side arm to a flat surface in contact with and normal to said probe tip is greater than a diameter of said main member.

27. The method as recited in claim 24, wherein cross sections of said main member and said side arm are substantially circular.

28. The method as recited in claim 24, wherein cross sections of said main member and said side arm are substantially square.

29. The method as recited in claim 24, wherein cross sections of said main member and said side arm are substantially rectangular.

30. The method as recited in claim 24, wherein cross sections of said main member and said side arm are substantially elliptical.

* * * * *